(12) United States Patent
Gopalan (10) Patent No.: US 9,729,129 B2
(45) Date of Patent: Aug. 8, 2017

(54) SYSTEM AND METHOD FOR REDUCING METASTABILITY IN CMOS FLIP-FLOPS

(71) Applicant: Bhaskar Gopalan, Chennai (IN)

(72) Inventor: Bhaskar Gopalan, Chennai (IN)

( * ) Notice: Subject to any disclaimer, the term of this patent is extended or adjusted under 35 U.S.C. 154(b) by 57 days.

(21) Appl. No.: 14/631,867

(22) Filed: Feb. 26, 2015

(65) Prior Publication Data

US 2016/0164502 A1  Jun. 9, 2016

(51) Int. Cl.
*H03K 3/037* (2006.01)

(52) U.S. Cl.
CPC ........... *H03K 3/0375* (2013.01); *H03K 3/037* (2013.01)

(58) Field of Classification Search
None
See application file for complete search history.

(56) References Cited

U.S. PATENT DOCUMENTS

| | | | | |
|---|---|---|---|---|
| 5,497,115 A | * | 3/1996 | Millar | G11C 7/1078 327/199 |
| 5,789,945 A | * | 8/1998 | Cline | H03K 3/0375 326/21 |
| 6,107,853 A | * | 8/2000 | Nikolic | H03K 3/356139 327/211 |
| 6,232,810 B1 | * | 5/2001 | Oklobdzija | H03K 3/012 327/217 |
| 6,404,253 B1 | * | 6/2002 | Hwang | H03K 3/35625 327/203 |
| 7,764,102 B2 | * | 7/2010 | Pacha | H03K 3/356121 327/208 |
| 2004/0196082 A1 | * | 10/2004 | Pacha | H03K 3/012 327/215 |

FOREIGN PATENT DOCUMENTS

| | | | |
|---|---|---|---|
| JP | 62-117410 | * | 5/1987 |
| JP | 5-235705 | * | 10/1993 |

* cited by examiner

*Primary Examiner* — Tuan T Lam
(74) *Attorney, Agent, or Firm* — Barry Choobin; Patent 360 LLC (57) ABSTRACT

A circuit and method for reducing metastability of a CMOS SR flip flop is provided. The circuit comprises a first switching module and a second switching module that are operatively coupled to a first and second output terminal of the CMOS SR flip-flop. The method includes injecting current onto the first and second output terminals of the CMOS SR flip-flop at mutually opposite directions during permissible mid-range voltages of the output terminals. Further, the method includes driving the output terminals of the CMOS SR flip-flop into the predetermined state of zero and predetermined stable state of Vdd by utilizing the currents injected onto the output terminals. As a result, the metastable point of the CMOS flip-flop is diverted from the corresponding metastable voltage and thereby reduces the metastability of the CMOS SR flip-flop.

4 Claims, 8 Drawing Sheets

SYSTEM AND METHOD FOR REDUCING METASTABILITY IN CMOS FLIP-FLOPS

CROSS REFERENCE TO RELATED APPLICATION

The application claims the priority of Indian Non-Provisional Patent Application with no. 6119/CHE/2014 filed on Dec. 5, 2014 with the title, "Reduction of Metastability in CMOS Flip-Flops", and the contents of which is incorporated in entirety by reference herein.

DEFINITION OF TERMS USED IN THIS SPECIFICATION

Predetermined state of zero: For a CMOS flip-flop, operating at a power supply voltage of 1.2 volts, the 'predetermined state of zero' is defined as 'Logic 0' level.

Predetermined stable state of $V_{dd}$: For a CMOS flip-flop, operating at a power supply Voltage of 1.2 volts, the 'predetermined stable state of $V_{dd}$' is defined as 'Logic 1' level.

BACKGROUND

Technical Field

The embodiments herein generally relate to CMOS flip-flops. The embodiments herein more particularly relates to improving performance of the CMOS flip-flop in a metastable state.

Description of Related Art

In flip-flop circuitry, a signal has to assume one of two logic values (either logic '0' or logic '1') in order to be processed correctly. A common problem in such circuitry is that, the flip-flops are often unavoidably given ambiguous control signals which lead to a state known as 'Metastability'. Metastability is a phenomenon that causes system failure, when a signal is transferred between circuitry in asynchronous clock domains. In metastable state, behavior of the flip-flop is unpredictable because outputs of the flip-flop assume values between logic 0 and 1, for an unusually longer period. As a result, the flip-flop acts in unpredictable ways and leads to ambiguous circuit states and erroneous data processing.

Moreover, metastable states are inherent features of flip-flops and cannot be completely avoided. The increasing expectations for reliable system operation make the prevention of metastability a basic consideration in flip-flops. There are several considerations, in practice, through which the effect of metastability is avoided. For example, one attempt to mitigate problem of metastable outputs in D flip-flop is to provide a second flip-flop in series with a first flip-flop (also known as 'dual flip-flop arrangement'). This arrangement makes an asynchronous input given to the D flip-flop to a synchronized input. The arrangement further prevents setup/hold time violations and makes Mean Time between Failure (MTBF) rates of a D flip-flop larger. In another consideration, the metastable behavior is reduced by identifying setup and hold timings of the flip-flop and giving localized energy during, the setup/hold timing, violations to bring outputs to known stable states.

However, in the dual flip-flop arrangement, delay from input-to-valid output is more as it includes the delay through each of the D flip-flops, plus the delay between clocks to the D flip-flops. Furthermore, the logic fails if the output of the first D flip-flop remains in the metastable region for a period greater than the delay between the clocks.

Hence there is a need for a simple circuitry to reduce metastability in the flip-flops and make the outputs to go into known stable states within a lesser time.

The above mentioned shortcomings, disadvantages and problems are addressed herein and which will be understood by reading and studying the following specification.

OBJECTIVES OF THE EMBODIMENTS

The primary object of the embodiments herein is to improve the performance of a CMOS SR flip-flop in the metastable state.

Another object of the embodiments herein is to make outputs of the CMOS SR flip-flop to go into known stable states within a lesser time during metastable state.

Yet another object of the embodiments herein is to reduce prolonged metastability of the CMOS SR flip-flop even if values of input signals to the CMOS SR flip-flop set the outputs in the metastable state.

Yet another object of the embodiments herein is to avoid the metastability of the CMOS SR flip-flop using a simple circuitry.

Yet another object of the embodiments herein is to improve the performance of a positive edge triggered D flip-flop in the metastable state.

Yet another object of the embodiments herein is to provide an easy implementation for short channel processes in Metal-Oxide-Semiconductor Field-Effect Transistor (MOSFETs), as the associated capacitances of the MOSFETs in the circuits are lesser for sub-micron node.

These and other objects and advantages of the embodiments herein will become readily apparent from the following detailed description taken in conjunction with the accompanying drawings.

SUMMARY

The first embodiment herein provides a circuit for reducing the metastability of the CMOS SR flip flop. The circuit comprises a first switching module and a second switching module that are operatively coupled to a first and second output terminal of the CMOS SR flip-flop. The output terminals are configured to receive injected current from the switching modules at mutually opposite directions respectively during permissible mid-range voltages of the output terminals. The switching modules are configured to drive the output terminals into a predetermined state of zero and a predetermined stable state of Vdd by utilizing the injected current onto the output terminals of the CMOS SR flip-flop. The switching modules further configured to divert a metastable point of the CMOS SR flip-flop from a corresponding metastable voltage into known stable states along with corresponding voltage noise, current noise, and cross-talk noise. Thus, the metastability of the CMOS SR flip-flop is reduced in the circuit.

The second embodiment herein provides a method for reducing the metastability of the e CMOS SR flip-flop. The method includes injecting current onto the first and second output terminals of the CMOS SR flip-flop at mutually opposite directions during permissible mid-range voltages of the output terminals. Further, the method includes driving the output terminals of the CMOS SR flip-flop into the predetermined state of zero and predetermined stable state of Vdd by utilizing the currents injected onto the output terminals. Furthermore, the method includes diverting the metastable point of the CMOS SR flip-flop from the corresponding metastable voltage and thereby reducing the metastability of the CMOS SR flip-flop.

The third embodiment herein provides a circuit for reducing the metastability of the positive edge triggered D flip-flop.

These and other aspects of the embodiments herein will be better appreciated and understood when considered in conjunction with the following description and the accompanying drawings. It should be understood, however, that the following descriptions, while indicating the preferred embodiments and numerous specific details thereof, are given by way of an illustration and not of a limitation. Many changes and modifications may be made within the scope of the embodiments herein without departing from the spirit thereof, and the embodiments herein include all such modifications.

BRIEF DESCRIPTION OF THE DRAWINGS

The other objects, features and advantages will occur to those skilled in the art from the following description of the preferred embodiment and the accompanying drawings in which.

Although the specific features of the embodiments herein are shown in some drawings and not in others. This is done for convenience only as each feature may be combined with any or all of the other features in accordance with the embodiments herein.

DETAILED DESCRIPTION OF THE EMBODIMENTS

In the following detailed description, a reference is made to the accompanying drawings that form a part hereof, and in which the specific embodiments that may be practiced is shown by way of illustration. These embodiments are described in sufficient detail to enable those skilled in the art to practice the embodiments and it is to be understood that the logical, mechanical and other changes may be made without departing from the scope of the embodiments. The following detailed description is therefore not to be taken in a limiting sense.

The first embodiment herein provides the circuit for reducing the metastability of the CMOS SR flip-flop. The circuit comprises the first switching module and the second switching module that are operatively coupled to the first output terminal and the second output terminal of the CMOS SR flip-flop. The output terminals are configured to receive the injected current from the switching modules at mutually opposite directions respectively during the permissible mid-range voltages of the outputs. The switching modules are configured to drive the output terminals into the predetermined state of zero and predetermined stable state of Vdd by utilizing the injected current onto the output terminals of the flip-flop. The switching modules further configured to divert the metastable point of the flip-flop from the corresponding metastable voltage into known stable state along with the corresponding voltage noise, current noise, and cross-talk noise.

The second embodiment herein provides the method for reducing the metastability of the CMOS SR flip-flop. The method includes injecting current onto the first and second output terminals of the flip-flop at dually opposite directions during permissible mid-range voltages of the output terminals. Further, the method includes driving the output terminals into the predetermined state of zero and predetermined stable state of Vdd by utilizing the currents injected onto the output terminals of the CMOS SR flip-flop. Furthermore, the method includes diverting the metastable point of the CMOS SR flip-flop from the corresponding metastable voltage and thereby reducing the metastability of the flip-flop.

Figure 1:
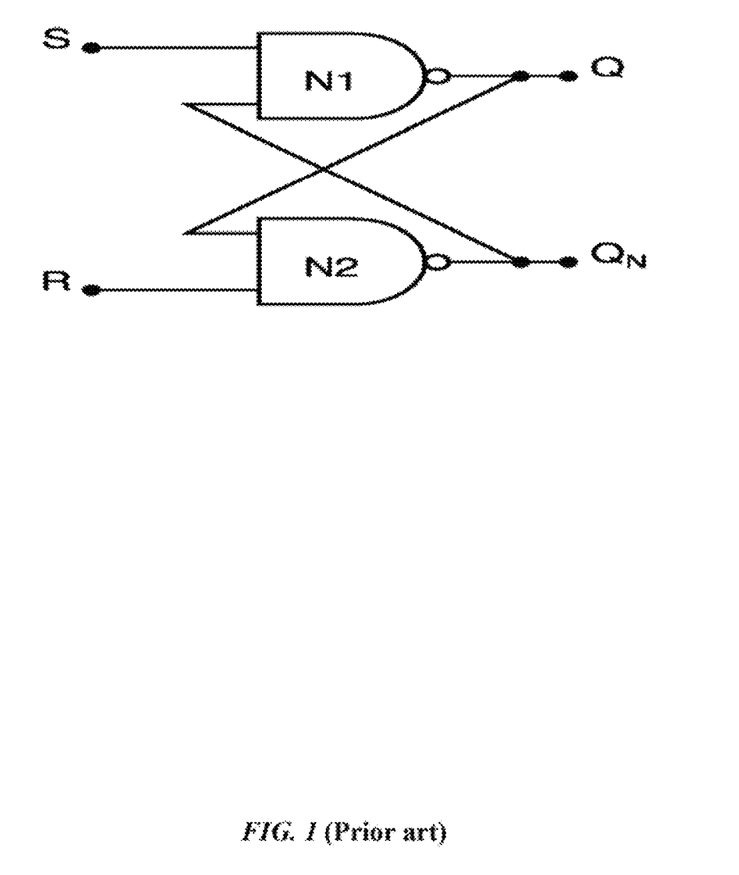
FIG. 1 illustrates a typical CMOS SR flip-flop circuit (prior art), according to one embodiment herein.

FIG. 1 illustrates the typical CMOS SR flip-flop circuit (prior art), according to one embodiment herein. As depicted in the figure (prior art), the typical CMOS SR flip-flop comprises two NAND gates (N1 and N2) with two input terminals (S and R) and two output terminals (Q and $Q_N$). The two NAND gates are cross coupled to each other. The SR description stands for 'Set-Reset'. The output of the CMOS SR flip-flop changes whenever the inputs to the S and R terminals are changed appropriately. The reset input resets the CMOS SR flip-flop (prior art) back to its original state with an output Q that is either at a logic level '1' or logic '0' depending upon the set/reset condition.

Figure 2:
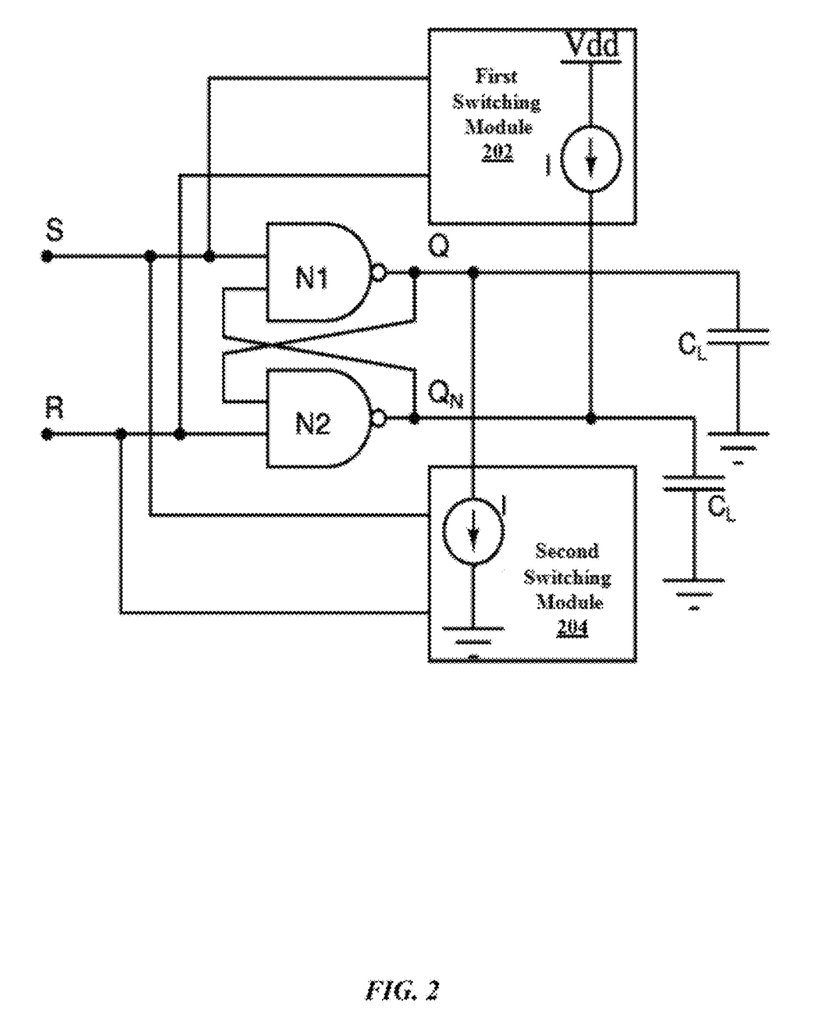
FIG. 2 illustrates a circuit diagram for reducing the metastability of the CMOS SR flip-flop, according to one embodiment herein.

FIG. 2 illustrates the circuit diagram for reducing the metastability of the CMOS SR flip-flop, according to the first embodiment as disclosed herein. The circuit comprises cross connected NAND gates forming a CMOS SR flip-flop, the first switching module 202, and the second switching module 204. The terminals 'S' and 'R' represents two inputs of the CMOS SR flip-flop. The terminals 'Q' and '$Q_N$' represent a first output terminal and second output terminal of the CMOS SR flip-flop respectively.

The first output terminal 'Q' and the second output terminal '$Q_N$' are configured to receive injected current at mutually opposite directions from the first switching module 202 and the second switching module 204 respectively during the permissible mid-range voltages of the output terminals. The first switching module 202 and the second switching module 204 are operatively coupled to the first output terminal 'Q' and the second output terminal '$Q_N$' of the CMOS SR flip-flop. Further, the first switching module 202 and the second switching module 202 are configured to divert the metastable point of the CMOS SR flip-flop from the corresponding metastable voltage into known stable state along with the corresponding voltage noise, current noise, and cross-talk noise, and thereby reduce the metastability of the CMOS SR flip-flop. Further, the first switching module 202 and the second switching module 204 uses S and R inputs of the CMOS SR flip-flop along with high gain inverters and non-inverters at the output terminals of Q and $Q_N$ respectively.

The metastability of the CMOS SR flip-flop for a short channel process node is given below:

'$C_L$' represents respective total effective capacitance at the output terminals 'Q' and '$Q_N$' of the CMOS SR flip-flop. '$V_{tn}$' and '$V_{tp}$' represents effective threshold voltages of NMOS and PMOS transistors in the CMOS SR flip-flop and '$K_n$' and '$K_p$' represents transconductance parameters of the NMOS and PMOS transistors respectively. 'Vdd' is the supply voltage to the CMOS SR flip-flop. In Metastability condition, both S and R signals of the CMOS SR flip-flop are at high level and transistors operate in saturation region. Further, the node equations at 'Q' and '$Q_N$' are $$C_L \frac{dQ}{dt} = -\frac{K_n}{2}(Q_N - vtn) + \frac{K_p}{2}(vdd - Q_N - |vtp|) - I \quad (1)$$

$$C_L \frac{dQ_N}{dt} = \frac{K_p}{2}(vdd - Q - |vtp|) - \frac{K_n}{2}(Q - vtn) + I \quad (2)$$

In the above equations (1 and 2), the transistor currents behave linearly with respect to the input voltages due to short channel effect or sub-micron process. The channel length modulations in the devices are neglected in equations (1) and (2). The current I is the proposed injected current which is injected just after start time (t=0+) to avoid or divert from metastable point. The current I in equation (1) is made negative to make 'Q' to reach zero if there is a metastable point and similarly '$Q_N$' to reach to Vdd.

Also, in the equations (1) and (2), it is assumed that $V_{dsat}$ of both NMOS and PMOS transistors in the flip-flop are assumed to be small so that saturation region is completely used when 'Q' is driven from metastate to zero and similarly when '$Q_N$' is driven from metastate to $V_{dd}$.

The time, $\tau$ is defined as:

$$\tau = \frac{2C_L}{K_p} \quad (3)$$

From equation (1) and (2), $$\tau^2 \frac{d^2 Q}{dt^2} - \left(1 + \frac{K_n}{K_p}\right)^2 Q = -\left(1 + \frac{K_n}{K_p}\right)\left(vdd - |vtp| + \frac{K_n vtn}{K_p} + \frac{2I}{K_p}\right) \quad (4)$$

The solution of equation (4) is given by $$Q(t) = A e^{m_0 t} + B e^{-m_0 t} + C_0 \quad (5)$$

Where $$m_0 = \frac{\left(1 + \frac{K_n}{K_p}\right)}{\tau} \quad (6)$$

and $$C_0 = \frac{\left(vdd - |vtp| + \frac{K_n vtn}{K_p} + \frac{2I}{K_p}\right)}{\left(1 + \frac{K_n}{K_p}\right)} \quad (7)$$

The metastable point of 'Q' is obtained by equating the currents in NMOS and PMOS devices in equation (2) at t=0 and is given by, $$Q_m = \frac{\left(vdd - |vtp| + \frac{K_n vtn}{K_p}\right)}{\left(1 + \frac{K_n}{K_p}\right)} \quad (8)$$

Similarly, metastable point for the output $Q_N$ is given by using equation (1) as, $$Q_{Nm} = Q_m \quad (9)$$

The following description defines the timing involved due to a constant perturbation or noise $2\delta$ at the beginning of time. Let $+2\delta$ be the perturbation or noise at the beginning of metastable state at the output Q and $-2\delta$ be the perturbation or noise at the output $Q_N$ at the start time. From the solution (5), at start time (t=0+), $$A + B = (2\delta - [C_0 - Q_m]) \quad (10)$$

$$A - B = \frac{1}{m_0} \frac{dQ(0)}{dt} \quad (11)$$

By using equation (1) and (6), $$\frac{1}{m_0} \frac{dQ(0)}{dt} = -\frac{2I}{(K_n + K_p)} \quad (12)$$

Therefore values of A and B are, $$A = \left(\delta - \frac{2I}{(K_n + K_p)}\right); B = \delta \quad (13)$$

After neglecting second term in (5), the solution for equation (5) is $$Q(0 \leq t \leq t_1) = \left(\delta - \frac{2I}{K_n + K_p}\right) e^{m_0 t} + C_0 \quad (14)$$

Similarly, for $Q_N(t)$ in the region of $0 \leq t \leq t_1$ is, $$Q_N(0 \leq t \leq t_1) = \left(-\delta + \frac{2I}{K_n + K_p}\right) e^{m_0 t} + C_{0N} \quad (15)$$

where $C_{0N}$ is given by, $$C_{0N} = \frac{\left(vdd - |vtp| + \frac{K_n vtn}{K_p} - \frac{2I}{K_p}\right)}{\left(1 + \frac{K_n}{K_p}\right)} \quad (16)$$

The equation (14) is valid from t=0+ to t=$t_1$, where $t_1$ is given by the condition that when $Q_N$ reaches from $Q_{Nm}$ to (Vdd-$|V_{tp}|$).

It is shown that Q(t) for $t_1 \leq t \leq t_2$ (where $t_2$ is given by the point that when Q reaches from $Q_m$ to $V_{tn}$), $$Q(t_1 \leq t \leq t_2) = \tag{17}$$
$$\left(\delta - \frac{2I}{K_n + K_p}\right)e^{m_1(t-t_1)} + \left(\delta - \frac{2I}{K_n + K_p}\right)(e^{m_0 t_1} - 1) + C_0$$

Similarly, for $Q_N(t)$ in this region is given by.

$$Q_N(t_1 \leq t \leq t_2) = \tag{18}$$
$$\left(-\delta + \frac{2I}{K_n + K_p}\right)e^{m_1(t-t_1)} + \left(-\delta + \frac{2I}{K_n + K_p}\right)(e^{m_0 t_1} - 1) + C_{0N}$$

Similarly $Q(t)$ above $t_2$ is, $$Q(t_2 \leq t \leq t_3) = \left(\delta - \frac{2I}{K_n + K_p}\right)e^{m_2(t-t_2)} + \tag{19}$$
$$\left(\delta - \frac{2I}{K_n + K_p}\right)e^{m_1(t_2-t_1)} + \left(\delta - \frac{2I}{K_n + K_p}\right)(e^{m_0 t_1} - 2) + C_0$$

and $Q_N(t)$ the region is, $$Q_N(t_2 \leq t \leq t_3) = \left(-\delta + \frac{2I}{K_n + K_p}\right)e^{m_2(t-t_2)} + \tag{20}$$
$$\left(-\delta + \frac{2I}{K_n + K_p}\right)e^{m_1(t_2-t_1)} + \left(-\delta + \frac{2I}{K_n + K_p}\right)(e^{m_0 t_2} - 2) + C_{0N}$$

where $t_3$ is given by the condition that when $Q(t)$ in equation (19) reaches zero or $Q_N(t)$ in equation (20) reaches $V_{dd}$.

The parameter $m_1$ is obtained from equation (1) and (2), $$m_1 = \frac{\sqrt{\frac{K_n}{K_p}\left(1 + \frac{K_n}{K_p}\right)}}{\tau} \tag{21}$$

Similarly, $m_2$ is obtained from equation (1) and (2) as, $$m_2 = \frac{\sqrt{\frac{K_n}{K_p}}}{\tau} \tag{22}$$

The time $t_3$ is given by equating the equation (19) to zero at $t=t_3$. The time t is the total time elapsed for the output 'Q' to reach zero if there is a perturbation $+2\delta$ at beginning of time.

The proposed method uses 130 nm, 1.2v IBM Technology process (BSIM3v3). The approximate total effective load capacitance $C_L$ is 300 f at the outputs of the CMOS SR flip-flop. Further, only minimum lengths are used for the flip-flop so as to reduce the associated capacitances. The injected current I at the outputs (in opposite directions) is 120 uA. The metastable point simulated is 587 mv. The simulated time t3 is approximately 400 ps (pico seconds) for a noise voltage of +3 mv at 'Q' and −3 mv at '$Q_N$', and the theoretical time $t_3$ is approximately 380 ps.

Figure 3:
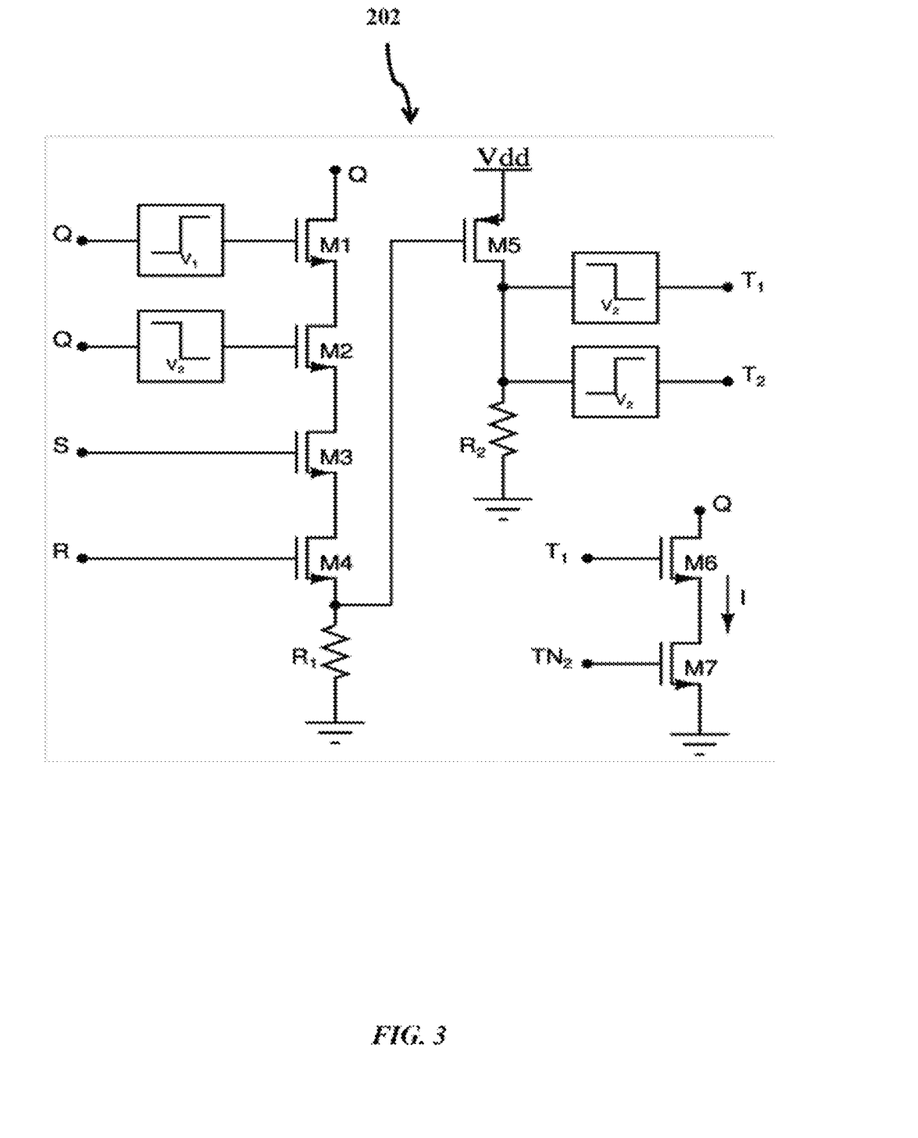
FIG. 3 illustrates a circuit diagram of a first switching module, according to one embodiment herein.

FIG. 3 illustrates a circuit diagram of the first switching module, according to the first embodiment as disclosed herein. As depicted in the FIG. 3 first switching module 202 comprises a Transistor M1, a Transistor M2, a Transistor M3, a Transistor M4, a Transistor M5, a Transistor M6, a Transistor M7, a Resistor $R_1$, a Resistor $R_2$, a switching non-inverter gate with switching voltage $V_1$, a switching inverter gate with switching voltage $V_2$ and a supply Vdd.

The transistor M1 gets input from the first output terminal 'Q' of the CMOS SR flip-flop. The input is passed through the switching non-inverter gate with switching voltage $V_1$ before passing the input to the transistor M1. The transistor M2 gets input from the first output terminal 'Q' of the CMOS SR flip-flop. The input is passed through the switching inverter gate with switching voltage $V_2$ before passing the input to the transistor M2. Transistors M3 and M4 get input from the input terminals S and R of the CMOS SR flip-flop respectively. The voltage across the resistor $R_1$ is developed only when voltage of the first output terminal 'Q' is in the mid-range, i.e. from $V_1$=525 mv to $V_2$=650 mv. The transistor M5 converts the voltage across the resistor $R_1$ to produce digital signals $T_1$ and $T_2$. Before producing the digital signals $T_1$ and $T_2$, the voltage across $R_1$ is passed through the switching inverter and non-inverter gates with switching voltage $V_2$ respectively so as to facilitate to obtain the injected current I. The transistor M5 and the resistor $R_2$ produce lesser voltage drop (lesser than $V_2$) at drain of the transistor M5 whenever there is a sufficient positive voltage across the resistor $R_1$. The switching voltages of the switching inverter gate and non-inverter gates are $V_1$=525 mv and $V_2$=650 mv. The injected current, I at the first output terminal Q is obtained from the signals $T_1$ and $TN_2$ driving the transistor M6 and the transistor M7 to make the first output terminal Q to go into the known state of zero.

Figure 4:
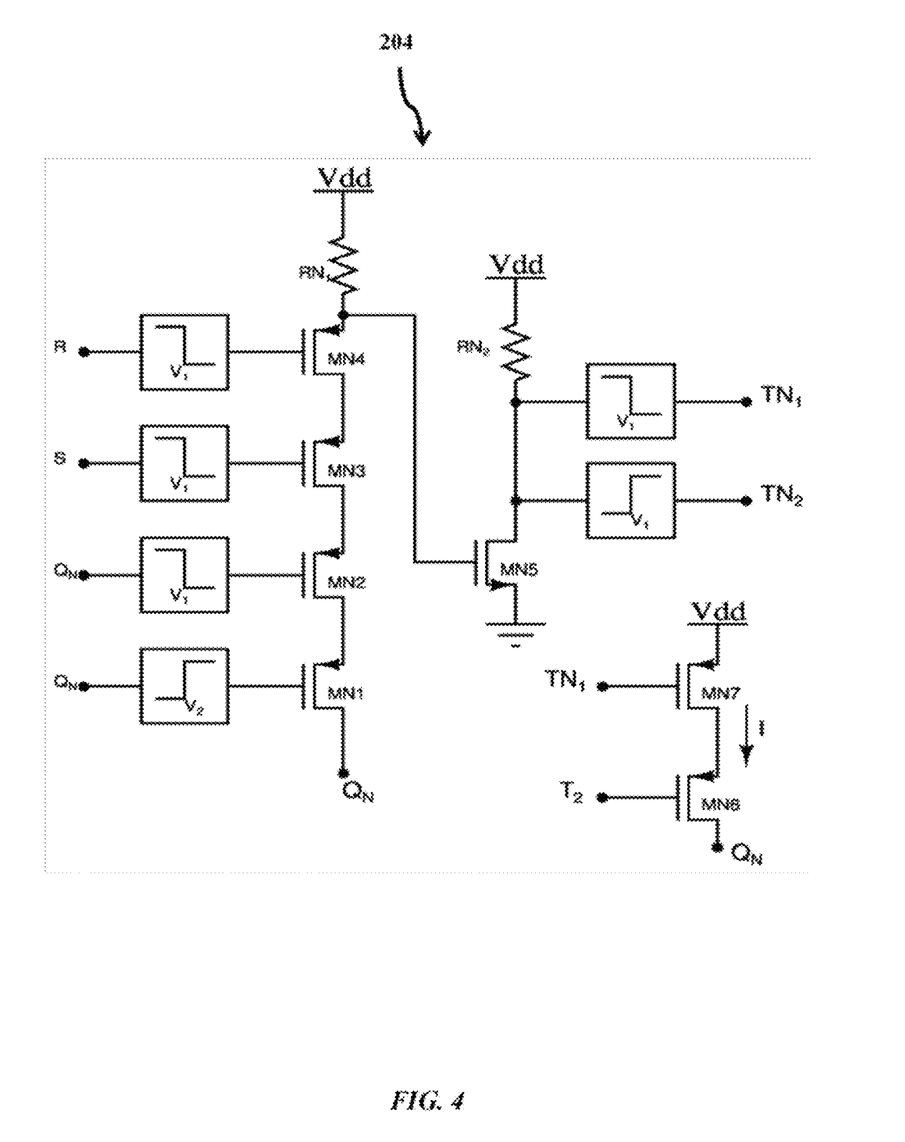
FIG. 4 illustrates a circuit diagram of a second switching module, according to one embodiment herein.

FIG. 4 illustrates a circuit diagram of the second switching module, according to the first embodiment as disclosed herein. As depicted in the FIG. 4, the second switching module 204 comprises a Transistor MN1, a Transistor MN2, a Transistor MN3, a Transistor MN4, a Transistor MN5, a Transistor MN6, a Transistor MN7, a Resistor $RN_1$, a Resistor $RN_2$, a switching inverter gate with switching voltage $V_1$, a switching non-inverter gate with switching voltage $V_2$, and a supply Vdd.

The transistor MN1 gets input from the second input terminal $Q_N$ of the CMOS SR flip-flop. The input is passed through the switching non-inverter gate with switching voltage $V_2$ before passing the input to the transistor MN1. The transistor MN2 gets input from the second output terminal $Q_N$. The input is passed through the switching inverter gate with switching voltage $V_1$ before passing the input to the transistor MN2. The transistors MN3 and MN4 get the input, from input terminals S and R of the CMOS SR flip-flop. The inputs are passed through the switching inverter gates with switching voltage $V_1$ respectively before passing the inputs to the transistors MN3 and MN4. The voltage across the resistor $RN_1$ is developed only when the voltage of second output terminal $Q_N$ is in the mid-range, i.e. from 525 mv to 650 mv. The transistor MN5 converts the voltage at the resistor $RN_1$ to produce digital signals TN1 and TN2 signals after passing through the switching inverter and non-inverter gates with switching voltage V1. The transistor MN5 and resistor $RN_2$ produce higher voltage (higher than $V_1$) at drain of the transistor MN5 whenever there is a sufficient drop across the resistor RN1. The injected current, I at the second output terminal $Q_N$ is obtained from the signals $T_2$ and TN1 driving the transistor MN6 and the transistor MN7 to make the first output terminal Q to go into the known predetermined stable state of Vdd.

Figure 5:
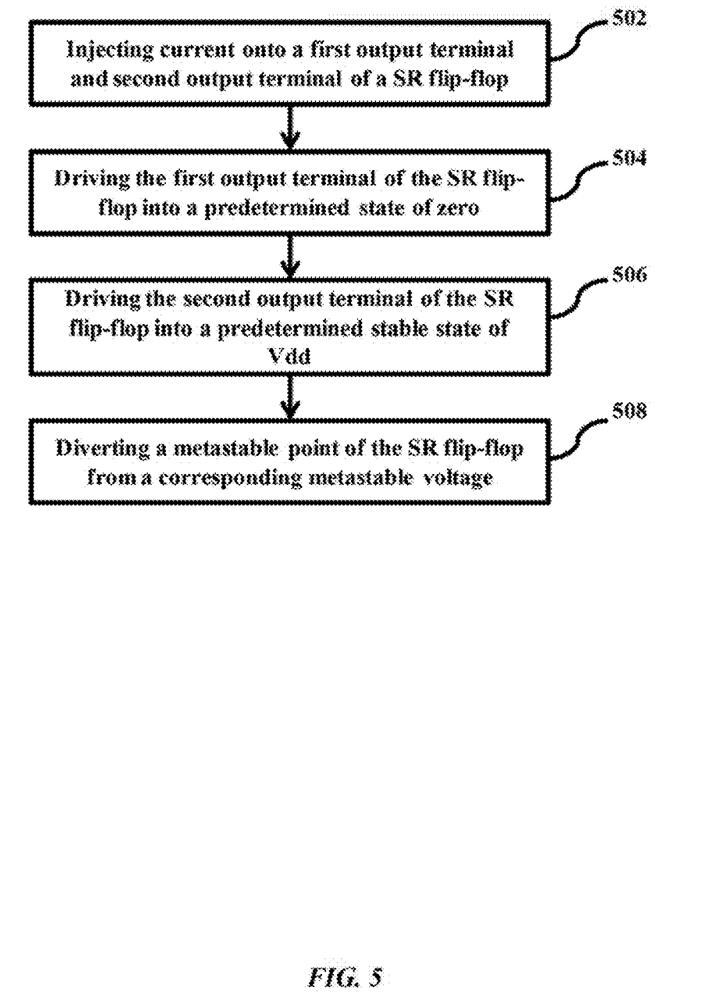
FIG. 5 illustrates a flow chart for reducing the metastability of the CMOS SR flip-flop, according to one embodiment herein.

FIG. 5 illustrates a flow chart for reducing the metastability of the CMOS SR flip-flop, according to a second embodiment as disclosed herein. The method includes injecting current onto the first output terminal and the second output terminals of the CMOS SR flip-flop at mutually opposite directions during permissible mid-range voltages of the output terminals (502). Further, the method includes driving the first output terminal of the CMOS SR flip-flop into the predetermined state of zero by utilizing the current injected onto the first output terminal (504). The method includes driving the second output terminal of the CMOS SR flip-flop into the predetermined stable state of Vdd by utilizing the current injected onto the second output terminal (506). Furthermore, the method includes diverting the metastable point of the CMOS SR flip-flop from the corresponding metastable voltage, at the first output terminal and the second output terminal respectively, and thereby reducing the metastability of the CMOS SR flip-flop (508).

Figure 6:
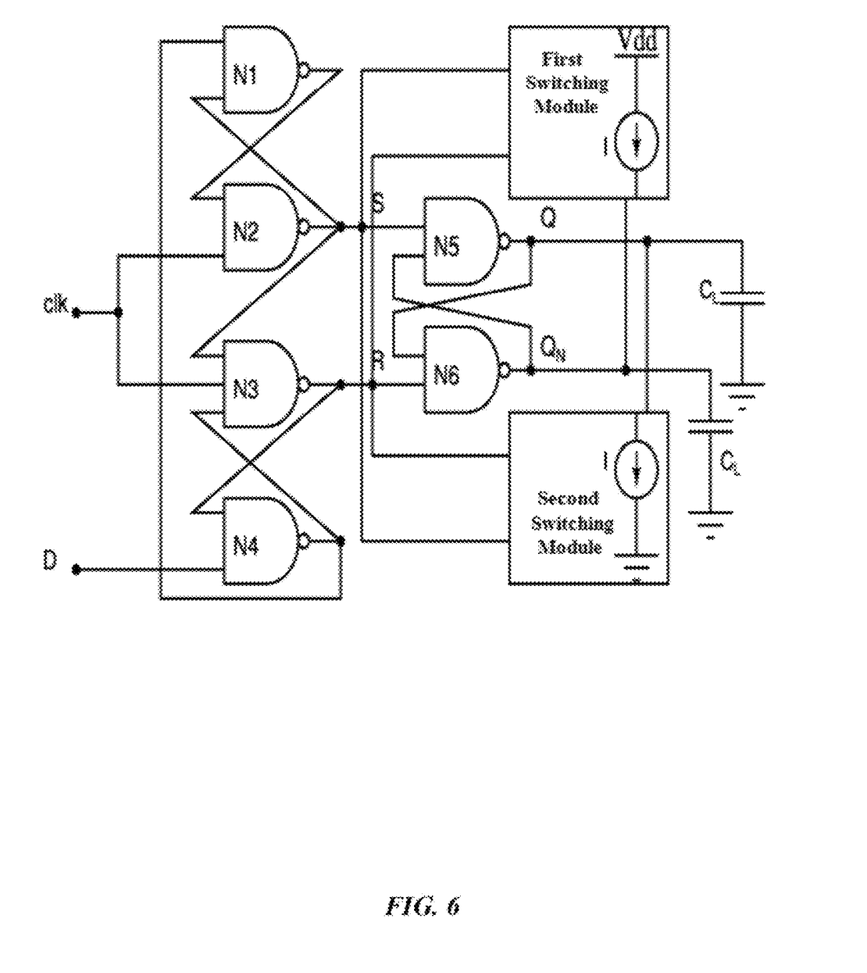
FIG. 6 illustrates a circuit diagram for reducing the metastability of the positive edge triggered D flip-flop, according to one embodiment herein.

FIG. 6 illustrates a circuit diagram for reducing the metastability of the positive edge triggered D flip-flop, according to a third embodiment as disclosed herein. The circuit comprises the first switching module, the second switching module, Latch N1, Latch N2, Latch N3, Latch N4, Latch N5, and Latch N6. The latches N1-N2 and N3-N4 respond to the external D input and clk signals. The latches N5-N6 produce the outputs of the D flip-flop. The input signals S and R of the output latch are maintained at the logic-1 level when clk=0 with irrespective of the levels of D-input signal and therefore the outputs of the D flip-flop remain in its present state. This is the state making D-flip-flop to go into metastability state if the D-data input start rising edge falls in the set-up time window. The same conditions are also applicable for hold time violation. The output terminal 'Q' goes into a low (zero) stable state when the metastability problem occurs in the D flip-flop. Further, the output terminal '$Q_N$' goes towards high (Vdd).

When the input clock in the positive-edge-triggered D flip-flop makes a positive transition, the value of D is transferred to the output terminal 'Q'. A negative transition of the clock does not affect the output. Furthermore, the output is not affected by changes in D when clk is in the steady logic-1 or the logic-0 level.

The D flip-flop along with the first switching module and the second switching, module diverts the metastable point of the D flip-flop from the corresponding metastable voltage, and from the corresponding voltage noise, current noise, and cross-talk noise. More protection against increased noise voltages is developed by increasing the injected current at the output terminals of the D flip-flop.

Figure 7:
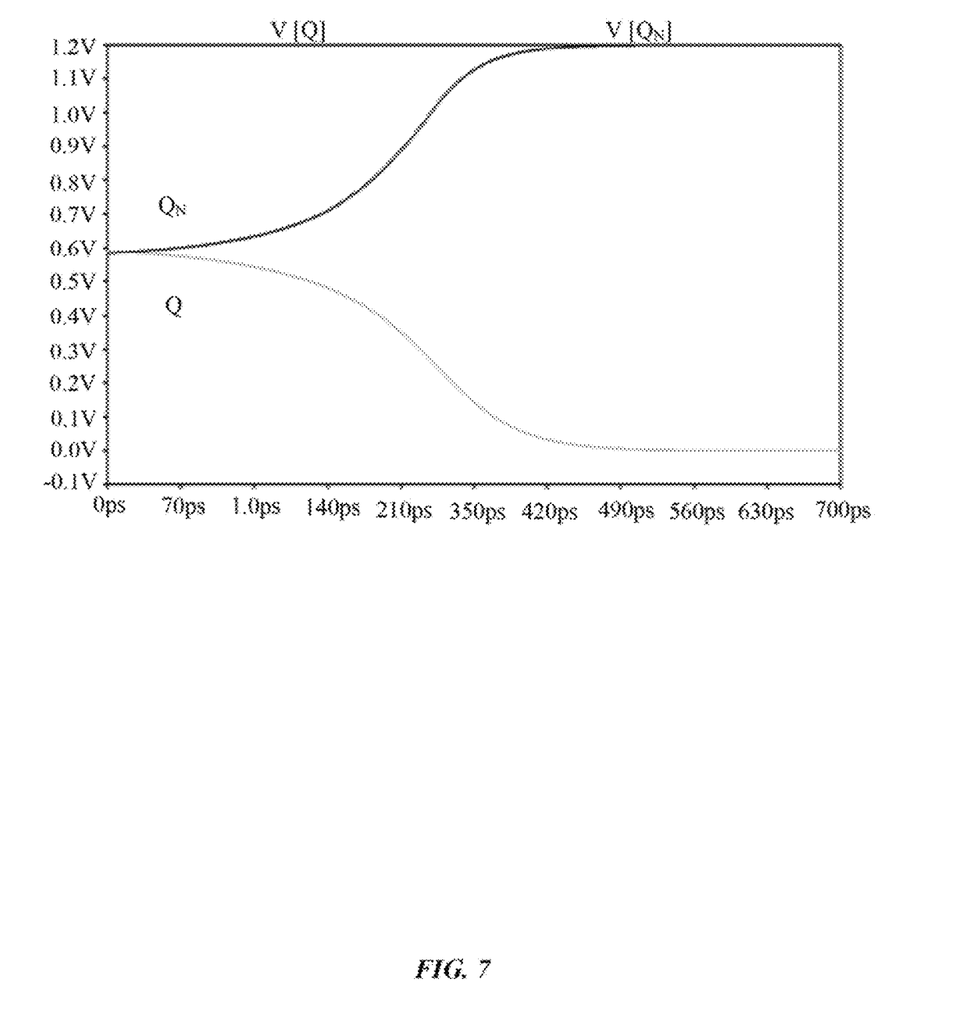
FIG. 7 illustrates a graph depicting simulated time under the metastable state of the CMOS SR flip-flop, according to one embodiment herein.

FIG. 7 illustrates the graph depicting simulated time under metastable state of the CMOS SR flip-flop, according to the first embodiment as disclosed herein. The X-axis of the graph represents simulated time of the CMOS SR flip-flop under the metastable state in Pico seconds (ps). The Y-axis of the graph represents output voltage of the CMOS SR flip-flop under the metastable state in volts (V). V(Q) is the output voltage of the CMOS SR flip-flop at the output terminal Q and V($Q_N$) is the output voltage of the CMOS SR flip-flop at the output terminal $Q_N$. The voltage at t=0 is 587 mv (metastable voltage).

The simulated time is, without injected current, during mid-range voltages and with a noise of −3 mv at the output Q and +3 mv at the output $Q_N$ of the flip-flop is approximately 600 ps. The FIG. 7 depicts the time $t_3$ (approximately 400 ps) when simulated with the injected current I=120 uA and a noise of 4-3 mv at the output 'Q' and a noise of −3 mv at the output '$Q_N$'. The time $t_3$ is less, when compared with the time simulated without injecting the current, due to increased current I at the outputs of the CMOS SR flip-flop.

Figure 8:
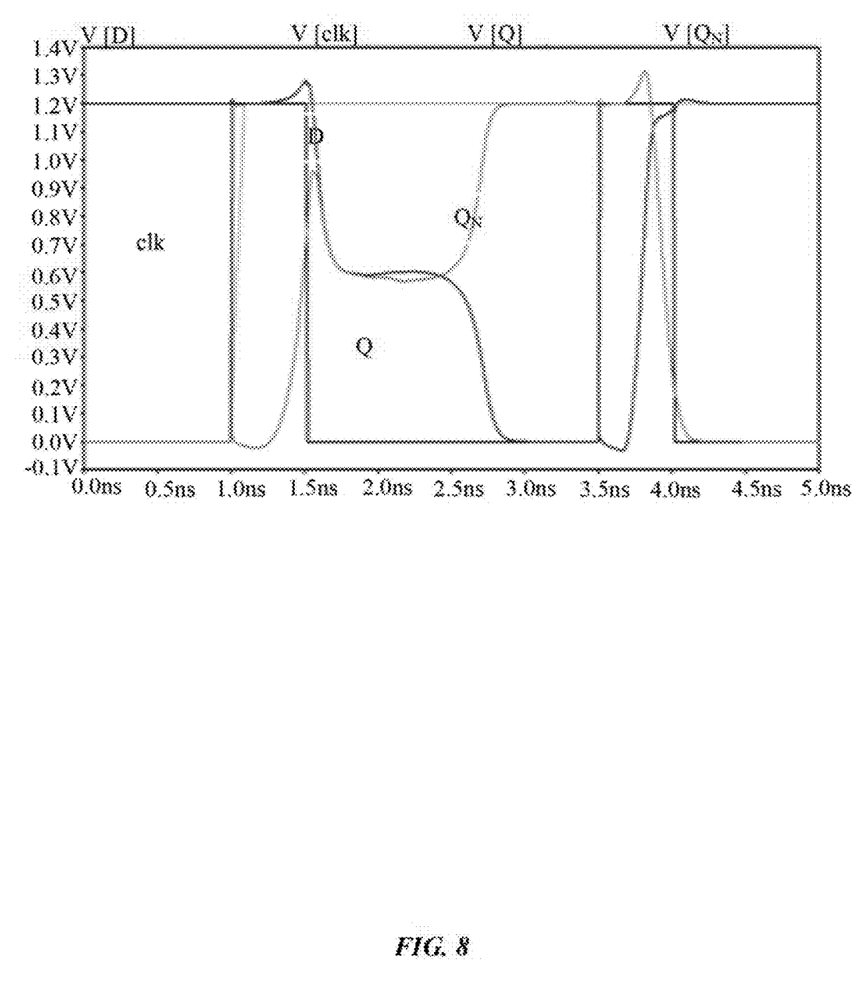
FIG. 8 illustrates a graph depicting outputs of the edge triggered D flip-flop under the metastable state, according to one embodiment herein.

FIG. 8 illustrates a graph depicting outputs of the edge triggered D flip-flop under metastability, according to the third embodiment as disclosed herein. The X-axis of the graph represents time of the edge triggered D flip-flop under metastability in nanoseconds (ns). The Y-axis of the graph represents output voltage of the edge triggered D under metastability in volts (V). V(clk) represents clock, and V(D) represents the input data given to the edge triggered D flip-flops. As depicted in the graph, during metastablity, the output 'Q' is driven towards 0 and the output '$Q_N$' is driven towards the power supply voltage Vdd. The injected current I is 120 uA at 2.1 ns and noise at 2.1 ns is +3 mv at the output Q and −3 mv at the output $Q_N$.

The system and method of the embodiments herein avoids metastability of the CMOS SR flip-flop and the positive edge triggered D flip-flop using a simple circuitry.

The system and method of the embodiments herein makes the outputs of the CMOS SR Flip-Flop and the positive edge triggered D flip-flop to go into known stable states within a lesser time during Metastable state.

The embodiments herein provide an easy implementation for short channel processes in MOSFETs, as the associated capacitances of the MOSFETs in the circuits are lesser for sub-micron node.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments.

It is to be understood that the phraseology or terminology employed herein is for the purpose of description and not of limitation. Therefore, while the embodiments herein have been described in terms of preferred embodiments, those skilled in the art will recognize that the embodiments herein can be practiced with modifications.

Although the embodiments herein are described with various specific embodiments, it will be obvious for a person skilled in the art to practice the embodiments herein with modifications. However, all such modifications are deemed to be within the scope of the claims.

It is also to be understood that the following claims are intended to cover all of the generic and specific features of the embodiments described herein and all the statements of the scope of the embodiments which as a matter of language might be said to fall there between.

What is claimed is:
1. A flip-flop comprising:
a first output terminal and a second output terminal, said first and second output terminals configured to receive injected current at mutually opposite directions thereof respectively during predetermined mid-range voltages thereof;
a first switching module operatively coupled to said first output terminal, said first switching module further configured to create a first voltage across a first resistor incorporated therein, only in an event that a voltage across the first output terminal is within a predetermined mid-range voltage, said first switching module still further configured to convert the first voltage into at least two digital signals $T_1$ and $T_2$, said digital signals $T_1$ and $T_2$ characterized by a first predetermined switching voltage;

a second switching module operatively coupled to said second output terminal, said second switching module further configured to create a second voltage across a second resistor incorporated therein, only in an event that a voltage across the second output terminal is within a predetermined mid-range voltage, said second switching module still further configured to convert the second voltage into at least two digital signals $TN_1$ and $TN_2$, said signals $TN_1$ and $TN_2$ characterized by a second predetermined switching voltage; and wherein said first switching module is further configured to derive the injected current at said first output terminal, based on a combination of digital signals $T_1$ and $T_2$, said first switching module further configured to utilize the injected current derived at the first output terminal, to drive the first output terminal to a known state of zero, and wherein said second switching module is further configured to derive the injected current at said second output terminal, based on a combination of digital signals $T_2$ and $TN_1$, said second switching module further configured to utilize the injected current derived at the second output terminal to drive the second output terminal to a known state of $V_{dd}$, thereby diverting a metastable point of the flip-flop from a corresponding metastable voltage at said first output terminal and said second output terminal respectively, and reducing the metastability of the flip-flop by reducing corresponding delay timings from a metastability point to zero and from the metastability point to the $V_{dd}$.

2. The flip-flop as claimed in claim 1, wherein the flip-flop is selected from the group consisting of a CMOS SR flip-flop, and an edge triggered D type flip-flop.

3. The flip-flop as claimed in claim 1, wherein said first switching module and second switching module are further configured to divert the metastable point of the flip-flop from at least one of corresponding metastable voltage, voltage noise, current noise, and cross-talk noise, thereby causing at least one of the voltage noise, current noise, and cross-talk noise to occur at a metastable point of the flip-flop thereby reducing variations in predetermined minimum setup and hold timings corresponding to the flip-flop.

4. A method for reducing the metastability of a flip-flop, said method comprising the following steps:

injecting current onto a first output terminal and a second output terminal at mutually opposite directions thereof, and during predetermined mid-range voltages thereof;

communicably coupling said first output terminal with a first switching unit and communicably coupling said second output terminal with a second switching unit;

creating a first voltage across a first resistor of the first switching module, only in an event that a voltage across the first output terminal is within a predetermined mid-range voltage;

converting the first voltage into at least two digital signals $T_1$ and $T_2$, said digital signals $T_1$ and $T_2$ characterized by a first predetermined switching voltage;

creating a second voltage across a second resistor of the second switching module, only in an event that a voltage across the second output terminal is within a predetermined mid-range voltage;

converting the second voltage into at least two digital signals $TN_1$ and $TN_2$, said digital signals $TN_1$ and $TN_2$ characterized by a second predetermined switching voltage;

deriving the injected current at said first output terminal based on a combination of digital signals $T_1$ and $TN_2$; and utilizing the injected current obtained at the first output terminal to drive the first output terminal to a known state of zero;

deriving the injected current at said second output terminal based on a combination of digital signals $T_2$ and $TN_1$, and utilizing the injected current obtained at the second output terminal to drive the second output terminal to a known state of $V_{dd}$; and diverting a metastable point of the flip-flop from a corresponding metastable voltage at said first output terminal and said second output terminal respectively; and reducing the metastability of the flip-flop by reducing corresponding delay timings from a metastability point of the flip-flop to zero and from the metastability point to the $V_{dd}$.

* * * * *